United States Patent
Hidaka et al.

(10) Patent No.: US 12,424,475 B2
(45) Date of Patent: Sep. 23, 2025

(54) CERAMIC JOINED BODY, ELECTROSTATIC CHUCK DEVICE, AND METHOD FOR PRODUCING CERAMIC JOINED BODY

(71) Applicant: SUMITOMO OSAKA CEMENT CO., LTD., Tokyo (JP)

(72) Inventors: Nobuhiro Hidaka, Tokyo (JP); Yukio Miura, Tokyo (JP); Jun Arikawa, Tokyo (JP); Hironori Kugimoto, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 402 days.

(21) Appl. No.: 17/790,002

(22) PCT Filed: Dec. 28, 2020

(86) PCT No.: PCT/JP2020/049220
§ 371 (c)(1),
(2) Date: Jun. 29, 2022

(87) PCT Pub. No.: WO2021/153154
PCT Pub. Date: Aug. 5, 2021

(65) Prior Publication Data
US 2023/0043148 A1 Feb. 9, 2023

(30) Foreign Application Priority Data

Jan. 31, 2020 (JP) .................. 2020-015793

(51) Int. Cl.
*H01L 21/683* (2006.01)
*C04B 37/00* (2006.01)

(52) U.S. Cl.
CPC ........ *H01L 21/6833* (2013.01); *C04B 37/003* (2013.01); *C04B 2237/064* (2013.01);
(Continued)

(58) Field of Classification Search
CPC ........... H01L 21/6833; H01L 21/67109; H01L 21/68757; H01L 21/6831; C04B 37/003;
(Continued)

(56) References Cited

U.S. PATENT DOCUMENTS 5,138,426 A * 8/1992 Umeda ................... H01L 23/10
257/750
6,071,630 A * 6/2000 Tomaru .................. B23Q 3/154
428/447
(Continued)

FOREIGN PATENT DOCUMENTS

| EP | 1986228 A1 * | 10/2008 | ......... H01L 21/6831 |
|---|---|---|---|
| JP | 2003-152062 A | 5/2003 | |
| JP | 2007-051045 A | 3/2007 | |
| JP | 2007-207840 A | 8/2007 | |
| JP | 2009-004649 A | 1/2009 | |
| WO | 2013/118781 A1 | 8/2013 | |
| WO | 2018/181130 A1 | 10/2018 | |
| WO | WO-2023176886 A1 * | 9/2023 | ......... H01L 21/6833 |

OTHER PUBLICATIONS

International Search Report for PCT/JP2020/049220 (Feb. 22, 2021).

*Primary Examiner* — Dharti H Patel
(74) *Attorney, Agent, or Firm* — Merchant & Gould P.C.

(57) ABSTRACT

A ceramic joined body (1) includes: a pair of ceramic plates (2,3) that include a conductive material; a conductive layer (4) and an insulating layer (5) that are interposed between the pair of ceramic plates (2, 3); and a pair of intermediate layers (6, 7) that are interposed between the pair of ceramic plates (2, 3) and the conductive layer (4) and are in contact with the pair of ceramic plates (2, 3) and the conductive layer (4).

20 Claims, 2 Drawing Sheets

(52) U.S. Cl.
CPC .. *C04B 2237/083* (2013.01); *C04B 2237/343* (2013.01); *C04B 2237/72* (2013.01)

(58) Field of Classification Search
CPC ........ C04B 2237/064; C04B 2237/083; C04B 2237/343; C04B 2237/72; C04B 2235/5436; C04B 2235/656; C04B 2235/3217; C04B 35/5607; C04B 2235/3826; C04B 2235/3839; C04B 2235/80; C04B 2237/36; C04B 2237/363; C04B 2237/365; C04B 2237/704; C04B 35/117; B32B 18/00; H02N 13/00
USPC ....................................................... 361/234
See application file for complete search history.

(56) References Cited

U.S. PATENT DOCUMENTS

| | | |
|---|---|---|
| 6,272,002 B1 | 8/2001 | Mogi et al. |
| 2008/0266746 A1* | 10/2008 | Handa ................. H01L 21/6831 361/234 |
| 2008/0315536 A1 | 12/2008 | Miyazawa et al. |
| 2014/0376148 A1 | 12/2014 | Sasaki et al. |
| 2017/0278738 A1* | 9/2017 | Ito ..................... H01L 21/67109 |
| 2020/0027770 A1 | 1/2020 | Hidaka et al. |

* cited by examiner

CERAMIC JOINED BODY, ELECTROSTATIC CHUCK DEVICE, AND METHOD FOR PRODUCING CERAMIC JOINED BODY

TECHNICAL FIELD

The present invention relates to a ceramic joined body, an electrostatic chucking device, and a method for producing a ceramic joined body.

This application is a National Stage Application of PCT/JP2020/049220, filed Dec. 28, 2020, which claims benefit of priority to Japanese Patent Application No. 2020-15793 filed on Jan. 31, 2020, the content of which is incorporated herein by reference. To the extent appropriate, a claim of priority is made to each of the above disclosed applications.

BACKGROUND ART

In the related art, in a semiconductor production step of producing a semiconductor device such as IC, LSI, or VLSI, a plate-shaped sample such as a silicon wafer is fixed to an electrostatic chuck member having an electrostatic chuck function by electrostatic adsorption, and a predetermined process is performed thereon.

When the plate-shaped sample is etched, for example, in a plasma atmosphere, a surface of the plate-shaped sample is heated to a high temperature by heat of the plasma, and there may be a problem in that, for example, a resist film of the surface is burst.

Here, in order to maintain the temperature of the plate-shaped sample at a desired given temperature, an electrostatic chucking device is used. The electrostatic chucking device includes an electrostatic chuck member and a base member for adjusting a temperature. On a bottom surface of the electrostatic chuck member, the base member for adjusting a temperature where a flow path that circulates a coolant for controlling a temperature to the inside of a metal member is formed is joined and integrated through a silicone adhesive.

In this electrostatic chucking device, the coolant for adjusting a temperature is circulated for heat exchange to the flow path of the base member for adjusting a temperature. That is, various plasma treatments are performed on the plate-shaped sample by performing electrostatic adsorption while maintaining the temperature of the plate-shaped sample fixed to a top surface of the electrostatic chuck member at a desired given temperature.

Incidentally, corrosion resistance, heat resistance, plasma resistance, durability to a load of heat cycle, and the like are required for the electrostatic chuck member of the electrostatic chucking device. As a member that realizes the electrostatic chucking device where the performance is excellent, an electrostatic chuck member is known including: an electrostatic chuck base body that is formed of a composite dielectric ceramic obtained by adding a conductive material to an insulating ceramic material; an internal electrode that is built in the electrostatic chuck base body; and a power feeding terminal that is provided in contact with the internal electrode (for example, refer to Patent Literatures Nos. 1 and 2).

CITATION LIST

Patent Literature

[Patent Literature No. 1] Japanese Laid-open Patent Publication No. 2003-152062

[Patent Literature No. 2] Japanese Laid-open Patent Publication No. 2007-051045

SUMMARY OF INVENTION

Technical Problem

A material of the internal electrode in the electrostatic chuck electrode-built susceptor described in Patent Literatures Nos. 1 and 2 is not particularly limited. This material is a high melting point material having high conductivity and may be a composite sintered compact including an insulating ceramic material and a conductive high melting point material. Joint surfaces of the composite dielectric ceramic of the electrostatic chuck base body and the internal electrode are joined generally after being polished. Therefore, the conductive material is exposed on each of the surfaces at the joint interface between the electrostatic chuck base body and the internal electrode. Therefore, at the interface between the electrostatic chuck base body and the internal electrode (conductive layer), a conductive path is likely to be formed such that the insulating characteristics are low. Accordingly, there is a problem in that breakdown (discharge) occurs at the joint interface between the composite dielectric ceramic and the internal electrode.

The present invention has been made in consideration of the above-described circumstances, and an object thereof is to provide a ceramic joined body in which the occurrence of breakdown (discharge) is suppressed at a joint interface between a ceramic plate and a conductive layer, an electrostatic chucking device including the ceramic joined body, and a method for producing the ceramic joined body.

Solution to Problem

In order to achieve the above-described object, according to a first aspect of the present invention, there is provided a ceramic joined body including: a pair of ceramic plates that include a conductive material; a conductive layer and an insulating layer that are interposed between the pair of ceramic plates; and a pair of intermediate layers that are interposed between the pair of ceramic plates and the conductive layer and are in contact with the pair of ceramic plates and the conductive layer.

It is also preferable that the first aspect of the present invention has the following characteristics. Two or more of the following characteristics may be combined with each other.

In the first aspect of the present invention, the conductive layer may be formed of a conductive material and an insulating material, and the insulating layer and the intermediate layer may be formed of an insulating material.

In the first aspect of the present invention, when a thickness of the conductive layer is represented by t1 and a total thickness of the intermediate layers is represented by t2, a thickness ratio R1 of the intermediate layers which is defined by a following formula (1) may be 3% or more.

$$R1 = t2/t1 \times 100 (\%) \tag{1}$$

In the first aspect of the present invention, an average primary particle diameter of the insulating material which forms the insulating layer may be 1.6 μm or more and 10.0 μm or less.

In the first aspect of the present invention, the ceramic plate may be formed of a composite body of aluminum oxide and silicon carbide.

In the first aspect of the present invention, the insulating materials which are included in the conductive layer, the insulating layer, and the intermediate layer may consist of aluminum oxide.

In the first aspect of the present invention, the conductive material which is included in the conductive layer may be at least one selected from the group consisting of $Mo_2C$, Mo, WC, W, TaC, Ta, SiC, carbon black, carbon nanotubes, and carbon nanofibers.

According to a second aspect of the present invention, there is provided an electrostatic chucking device, in which an electrostatic chuck member formed of a ceramic and a base member for adjusting a temperature formed of a metal are joined through an adhesive layer, and the electrostatic chuck member is formed of the ceramic joined body according to the first aspect of the present invention.

According to a third aspect of the present invention, there is provided a method for producing a ceramic joined body, the method including: a step of preparing a first ceramic plate including a conductive material and a second ceramic plate including a conductive material; a step of applying a paste for forming an intermediate layer to one surface of the first ceramic plate to form a first intermediate layer coating film; a step of applying a paste for forming a conductive layer to a surface of the first intermediate layer coating film opposite to a surface thereof which is in contact with the first ceramic plate, to form a conductive layer coating film; a step of applying a paste for forming an intermediate layer to a surface of the conductive layer coating film opposite to a surface thereof which is in contact with the first intermediate layer coating film, to form a second intermediate layer coating film; a step of laminating the second ceramic plate on a surface of the second intermediate layer coating film opposite to a surface thereof which is in contact with the conductive layer coating film; and a step of pressurizing a laminate including the first ceramic plate, the first intermediate layer coating film, the conductive layer coating film, the second intermediate layer coating film, and the second ceramic plate in a thickness direction while heating the laminate.

With the production method according to the third aspect, the ceramic joined body according to the first aspect can be preferably produced.

Advantageous Effects of Invention

According to the present invention, it is possible to provide a ceramic joined body in which the occurrence of breakdown (discharge) is suppressed at a joint interface between a ceramic plate and a conductive layer, an electrostatic chucking device including the ceramic joined body, and a method for producing the ceramic joined body.

DESCRIPTION OF EMBODIMENTS

Preferable examples of embodiments of a ceramic joined body, an electrostatic chucking device, and a method for producing a ceramic joined body according to the present invention will be described.

The embodiment will be described in detail for easy understanding of the concept of the present invention, but the present invention is not limited thereto unless specified otherwise. Within a range not departing from the scope of the present invention, changes, omissions, or additions can be made for a number, a position, a size, a numerical value, a ratio, a material, or the like.

[Ceramic Joined Body]

First Embodiment

Hereinafter, a preferable example of a ceramic joined body according to one embodiment of the present invention will be described with reference to FIG. 1.

In all of the following drawings, dimensions, ratios, and the like of the components may be appropriately different from the actual ones in order to easily understand the drawings.

Figure 1:
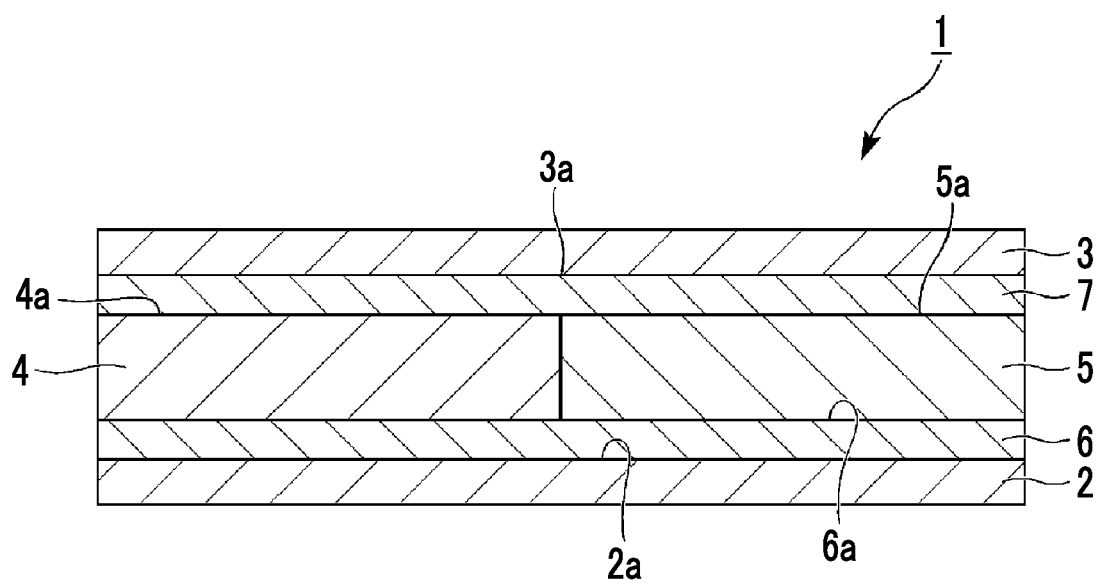
FIG. 1 is a schematic cross-sectional view showing an example of a ceramic joined body according to one preferable embodiment of the present invention.

FIG. 1 is a schematic cross-sectional view showing the ceramic joined body according to the embodiment. As shown in FIG. 1, a ceramic joined body 1 according to the embodiment includes: a pair of ceramic plates 2 and 3 that include a conductive material; a conductive layer 4 and an insulating layer 5 that are interposed between the pair of ceramic plates 2 and 3; and intermediate layers 6 and 7 that are interposed between the pair of ceramic plates 2 and 3 and the conductive layer 4 and the insulating layer 5 and are in contact with the pair of ceramic plates 2 and 3, the conductive layer 4, and the insulating layer 5.

Hereinafter, the ceramic plate 2 will be referred to as the first ceramic plate 2, the ceramic plate 3 will be referred to as the second ceramic plate 3, the intermediate layer 6 will be referred to as the first intermediate layer 6, and the intermediate layer 7 will be referred to as the second intermediate layer 7.

As shown in FIG. 1, in the ceramic joined body 1, the first ceramic plate 2, the first intermediate layer 6, a combination of the conductive layer 4 and the insulating layer 5, the second intermediate layer 7, and the second ceramic plate 3 are laminated in this order from the lower side in the drawing. That is, the ceramic joined body 1 is a joined body in which the first ceramic plate 2 and the second ceramic plate 3 are joined and integrated through the first intermediate layer 6, the conductive layer 4, the insulating layer 5, and the second intermediate layer 7. In the drawing, the insulating layer 5 is disposed on an outer periphery of the conductive layer 4. Upper and lower main surfaces of the conductive layer 4 and the insulating layer 5 and an interface between the conductive layer 4 and the insulating layer 5 are in contact with the first intermediate layer 6 and the second intermediate layer 7 that are disposed above and below the layers 4 and 5.

It is preferable that shapes of overlapping surfaces of the first ceramic plate 2 and the second ceramic plate 3 are the same. The shape of the ceramic plate can be freely selected, and may be, for example, a circular shape, a donut shape, a square shape, or a rectangular shape but is not limited to only these examples.

The thicknesses of the first ceramic plate 2 and the second ceramic plate 3 can be freely selected without any particular limitation and can be appropriately adjusted depending on the use of the ceramic joined body 1. For example, the thicknesses may be 0.3 to 3.0 mm, 0.4 to 2.5 mm, or 0.5 to 1.5 mm but is not limited to only these examples. The thicknesses of the ceramic plates 2 and 3 may be the same as or different from each other.

The first ceramic plate 2 and the second ceramic plate 3 have the same composition or the same major component. That is, the first ceramic plate 2 and the second ceramic plate 3 may have the same composition or may have different compositions. The first ceramic plate 2 and the second ceramic plate 3 are formed of a composite body of an insulating material and a conductive material. It is preferable that the composite body consists of only an insulating material and a conductive material. The insulating material in the first ceramic plate 2 and the second ceramic plate 3 is not particularly limited, and examples thereof include at least one selected from aluminum oxide ($Al_2O_3$), aluminum nitride (AlN), yttrium oxide ($Y_2O_3$), yttrium-aluminum-garnet (YAG), and the like. In addition, the conductive material in the first ceramic plate 2 and the second ceramic plate 3 is not particularly limited, and examples thereof include at least one selected from silicon carbide (Sic), titanium oxide ($TiO_2$), titanium nitride (TiN), titanium carbide (TiC), carbon (C), carbon nanotubes (CNT), carbon nanofibers, rare earth oxide, rare earth fluoride, and the like.

The proportion of the insulating material in the composite body can be freely selected, is preferably 80% to 99% by mass and preferably 85% to 98% by mass, and is not limited to only these examples. The proportion may be, for example, 80% to 95% by mass or may be 83% to 90% by mass. The proportion of the conductive material in the composite body can be freely selected, is preferably 1% to 20% by mass and preferably 2% to 15% by mass, and is not limited to only these examples. The proportion may be, for example, 3% to 12% by mass or may be 5% to 10% by mass.

It is preferable that the material (composite body) of the first ceramic plate 2 and the second ceramic plate 3 has a volume specific resistance value of about $10^{13}$ Ω·cm or more and $10^{15}$ Ω·cm or less, has a mechanical strength, and has durability to corrosive gas and plasma thereof. Examples of the material include an aluminum oxide ($Al_2O_3$) sintered compact, an aluminum nitride (AlN) sintered compact, and an aluminum oxide ($Al_2O_3$)-silicon carbide (SiC) composite sintered compact. From the viewpoints of dielectric characteristics, high corrosion resistance, plasma resistance, and heat resistance at a high temperature, an aluminum oxide ($Al_2O_3$)-silicon carbide (SiC) composite sintered compact is preferable.

The conductive layer 4 is, for example, a layer that is used as an electrode for plasma generation that applies high frequency power to generate plasma for a plasma treatment, an electrode for an electrostatic chuck that generates charges and fixes a plate-shaped sample due to an electrostatic adsorption force, and/or a heater electrode that heats a plate-shaped sample by electric heating. The shape of the conductive layer 4 (the shape of the conductive layer 4 when seen in a plan view (when seen from a thickness direction)) or the size of the conductive layer 4 (the thickness or the area of the conductive layer 4 when seen in a plan view (when seen from a thickness direction)) is not particularly limited and is appropriately adjusted depending on the use of the ceramic joined body 1. The thickness of the conductive layer 4 is freely selected, is, for example, preferably 5 to 200 μm, more preferably 8 to 150 μm, and still more preferably 10 to 100 μm, and is not limited to only these examples. The shape of the conductive layer 4 is freely selected or may be, for example, a circular shape, a donut shape, a square shape, or a rectangular shape in a plan view.

The conductive layer 4 is formed of a conductive material and an insulating material. It is preferable that the conductive layer 4 is formed of a conductive compound material consisting of only a conductive material and an insulating material.

It is preferable that the conductive material in the conductive layer 4 is at least one selected from the group consisting of molybdenum carbide ($Mo_2C$), molybdenum (Mo), tungsten carbide (WC), tungsten (W), tantalum carbide (TaC), tantalum (Ta), silicon carbide (SiC), carbon black, carbon nanotubes, and carbon nanofibers. The conductive material in the conductive layer 4 is formed of at least one selected from the group consisting of the above-described materials such that the conductivity of the conductive layer can be secured.

The insulating material in the conductive layer 4 is not particularly limited, and examples thereof include at least one selected from aluminum oxide ($Al_2O_3$), aluminum nitride (AlN), yttrium oxide ($Y_2O_3$), yttrium-aluminum-garnet (YAG), and the like. It is also preferable that the insulating material in the conductive layer 4 is the same as the insulating material of the first ceramic plate 2 and the second ceramic plate 3.

The conductive layer 4 is formed of a conductive material and an insulating material, and the joint strength of the first ceramic plate 2 and the second ceramic plate 3 and the mechanical strength as an electrode are strong. The insulating material in the conductive layer 4 is aluminum oxide ($Al_2O_3$) such that dielectric characteristics, high corrosion resistance, plasma resistance, and heat resistance at a high temperature are maintained.

A ratio (mixing ratio) between the contents of the conductive material and the insulating material in the conductive layer 4 is not particularly limited and is appropriately adjusted depending on the use of the ceramic joined body 1.

The proportion of the insulating material used in the conductive layer 4 can be freely selected, is preferably 20% to 60% by mass and preferably 25% to 55% by mass with respect to the total amount of the conductive material and the insulating material, and is not limited to only these examples. The proportion may be, for example, 35% to 50% by mass or 40% to 45% by mass.

The proportion of the conductive material used in the conductive layer 4 can be freely selected, is preferably 40% to 80% by mass and preferably 45% to 75% by mass with respect to the total amount, and is not limited to only these examples. The proportion may be, for example, 50% to 65% by mass or 43% to 60% by mass.

The insulating layer 5 is a layer that is provided for joining boundary portions of the first ceramic plate 2 and the second ceramic plate 3, that is, outer peripheral regions other than a portion where the conductive layer 4 is formed. The shape of the insulating layer 5 (the shape of the insulating layer 5 when seen in a plan view (when seen from the thickness direction) is not particularly limited and is appropriately adjusted depending on the shape of the conductive layer 4.

In the ceramic joined body 1 according to the embodiment, it is preferable that the thickness of the insulating layer 5 is the same as the thickness of the conductive layer 4. The shape of the insulating layer 5 is freely selected, may be, for example, a circular shape, a donut shape, a square shape, or a rectangular shape in a plan view, but is not limited to only these examples. The shape of the insulating layer 5 may be a shape surrounding the conductive layer 4 in a plan view.

The insulating layer 5 is formed of only an insulating material.

The insulating material forming the insulating layer 5 is not particularly limited and is preferably the same as the insulating material of the first ceramic plate 2 and the second ceramic plate 3. Examples of the insulating material forming the insulating layer 5 include at least one selected from aluminum oxide ($Al_2O_3$), aluminum nitride (AlN), yttrium oxide ($Y_2O_3$), yttrium-aluminum-garnet (YAG), and the like. It is preferable that the insulating material forming the insulating layer 5 consists of only aluminum oxide ($Al_2O_3$). The insulating material forming the insulating layer 5 is aluminum oxide ($Al_2O_3$) such that dielectric characteristics, high corrosion resistance, plasma resistance, and heat resistance at a high temperature are preferably maintained.

The average primary particle diameter of the insulating material forming the insulating layer 5 is preferably 1.6 μm or more and 10.0 μm or less, more preferably 1.6 μm or more and 8.0 μm or less, and still more preferably 1.6 μm or more and 6.0 μm or less. The value may be, for example, 1.6 to 2.5 μm, 2.5 to 3.5 μm, or 3.5 to 5.0 μm. The average primary particle diameter of the insulating material forming the insulating layer 5 may refer to the average primary particle diameter of powder of the insulating material as the material forming the insulating layer 5, that is, the raw material.

When the average primary particle diameter of the insulating material forming the insulating layer 5 is 1.6 μm or more, sufficient voltage endurance can be obtained. On the other hand, when the average primary particle diameter of the insulating material forming the insulating layer 5 is 10.0 μm or less, workability of grinding or the like is excellent.

The first intermediate layer 6 is interposed between the first ceramic plate 2 and the conductive layer 4 and the insulating layer 5 and is provided for insulating the first ceramic plate 2 and the conductive layer 4 from each other. The second intermediate layer 7 is interposed between the second ceramic plate 3 and the conductive layer 4 and the insulating layer 5 and is provided for insulating the second ceramic plate 3 and the conductive layer 4 from each other. The shape of the first intermediate layer 6 and the second intermediate layer 7 (the shape of the first intermediate layer 6 and the second intermediate layer 7 when seen in a plan view (when seen from the thickness direction) is not particularly limited and is appropriately adjusted depending on the shape of the conductive layer 4 and the insulating layer 5. For example, the shape may be a circular shape, a donut shape, a square shape, or a rectangular shape but is not limited to only these examples. The shape of the first intermediate layer 6 and the second intermediate layer 7 may be the same as that of the conductive layer 4 in a plan view or may be the same as that of a combination of the conductive layer 4 and the insulating layer 5.

The thickness of the first intermediate layer 6 and the thickness of the second intermediate layer 7 can be freely selected and may be the same as or different from each other. However, it is preferable that the thicknesses are the same.

When the thickness of the conductive layer 4 is represented by t1 and the sum of the thickness of the first intermediate layer 6 and the thickness of the second intermediate layer 7 is represented by t2, a ratio (R1) of the sum t2 of the thickness of the first intermediate layer 6 and the thickness of the second intermediate layer 7 to the thickness t1 of the conductive layer 4 that is defined by the following formula (1) is preferably 3% or more and more preferably 8% or more.

$$R1 = t2/t1 \times 100 (\%) \quad (1)$$

When R1 is 3% or more, a conductive path is not likely to be formed at an interface between the ceramic plate and the internal electrode, and thus sufficient lateral dielectric strength can be obtained.

In addition, R1 is preferably 50% or less and more preferably 40% or less. When R1 is more than 50%, the conductive layer 4 cannot obtain a sufficient thickness. Therefore, uniform adsorption force, temperature uniformity, and the like decrease, which is not preferable. Optionally, the ratio (R1) may be 3% to 30%, 3% to 20%, or 3% to 15%.

The thickness t1 of the conductive layer and the sum t2 of the thickness of the first intermediate layer and the thickness of the second intermediate layer may be values obtained by observing a cross-section of the ceramic joined body with a SEM.

The first intermediate layer 6 and the second intermediate layer 7 are formed of an insulating material. It is preferable that the first intermediate layer 6 and the second intermediate layer 7 are formed of only an insulating material. The first intermediate layer 6 and the second intermediate layer 7 may have the same composition or may have different compositions.

The insulating materials forming the first intermediate layer 6 and the second intermediate layer 7 is not particularly limited. It is preferable that the insulating materials of the first ceramic plate 2 and the second ceramic plate 3 are the same. Examples of the insulating materials include at least one selected from aluminum oxide ($Al_2O_3$), aluminum nitride (AlN), yttrium oxide ($Y_2O_3$), yttrium-aluminum-garnet (YAG), and the like. The materials of the first intermediate layer 6 and the second intermediate layer 7 may be the same as or different from each other and are preferably the same. It is preferable that the insulating material forming the first intermediate layer 6 and the second intermediate layer 7 is formed of only aluminum oxide ($Al_2O_3$). The insulating material forming the first intermediate layer 6 and the second intermediate layer 7 is aluminum oxide ($Al_2O_3$) such that dielectric characteristics, high corrosion resistance, plasma resistance, and heat resistance at a high temperature are maintained. It is also preferable that the intermediate layer is formed of the same material as that of the insulating layer.

The ceramic joined body 1 according to the embodiment includes: the pair of ceramic plates 2 and 3 that include a conductive material; the conductive layer 4 and the insulating layer 5 that are interposed between the ceramic plates 2 and 3; and the intermediate layers 6 and 7 that are interposed between the ceramic plates 2 and 3 and the conductive layer 4 and are in contact with the ceramic plates 2 and 3 and the conductive layer 4. Therefore, the ceramic plates 2 and 3 and the conductive layer 4 are insulated from each other by the intermediate layers 6 and 7, and the occurrence of breakdown (discharge) can be suppressed at a joint interface between the ceramic plates 2 and 3 and the conductive layer 4.

Second Embodiment

Figure 2:
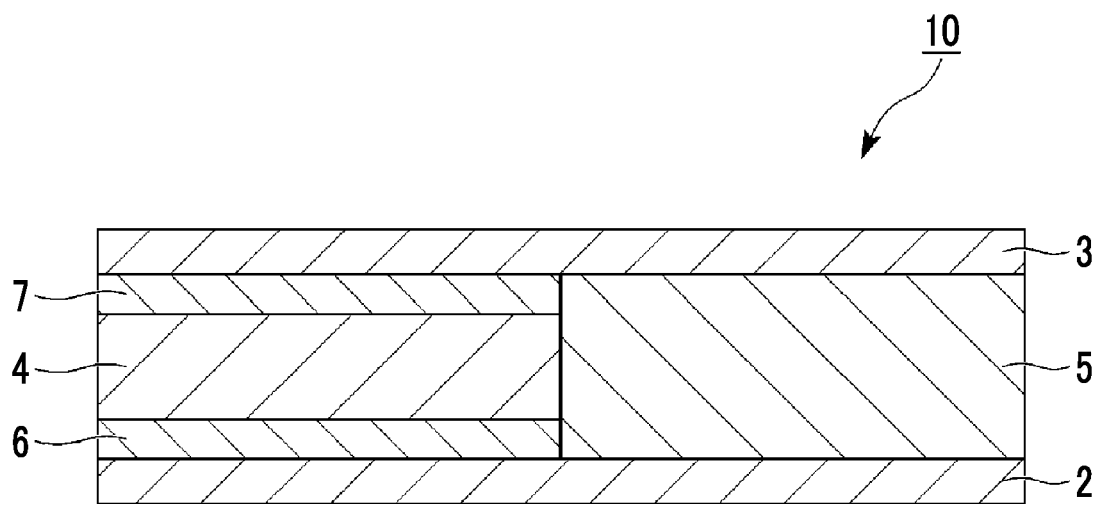
FIG. 2 is a schematic cross-sectional view showing an example of a ceramic joined body according to one preferable embodiment of the present invention.

FIG. 2 is a schematic cross-sectional view showing a preferable example of a ceramic joined body according to the embodiment. In FIG. 2, the same components as those of the ceramic joined body shown in FIG. 1 are represented by the same reference numerals, and the repeated description thereof will not be repeated.

As shown in FIG. 2, a ceramic joined body 10 according to the embodiment includes: the pair of ceramic plates 2 and 3 that include a conductive material; the conductive layer 4 and the insulating layer 5 that are interposed between the pair of ceramic plates 2 and 3; and the intermediate layers 6 and 7 that are interposed between the pair of ceramic plates 2 and 3 and the conductive layer 4 and are in contact with the ceramic plates 2 and 3 and the conductive layer 4. The insulating layer 5 may be formed on and in contact with the outer periphery of the conductive layer 4.

As shown in FIG. 2, in the ceramic joined body 10, in a region where the conductive layer 4 is provided in a plan view, the first ceramic plate 2, the first intermediate layer 6, the conductive layer 4, the second intermediate layer 7, and the second ceramic plate 3 are laminated in this order. In addition, in a region where the insulating layer 5 is provided in a plan view, the first ceramic plate 2, the insulating layer 5, and the second ceramic plate 3 are laminated in this order. That is, in the ceramic joined body 10, in a region where the conductive layer 4 is provided, the first ceramic plate 2 and the second ceramic plate 3 are joined and integrated through the first intermediate layer 6, the conductive layer 4, and the second intermediate layer 7. In a region where the insulating layer 5 is provided, the first ceramic plate 2 and the second ceramic plate 3 are joined and integrated through the insulating layer 5.

In the ceramic joined body 10 according to the embodiment, the same effect as that of the ceramic joined body 1 according to the first embodiment can be obtained.

[Method for Producing Ceramic Joined Body]

A method for producing the ceramic joined body according to the embodiment includes: a step of applying a paste for forming an intermediate layer to one surface of a first ceramic plate including a conductive material to form a first intermediate layer coating film (hereinafter, referred to as "first step"); a step of applying a paste for forming a conductive layer to a surface of the first intermediate layer coating film opposite to a surface thereof in contact with the first ceramic plate to form a conductive layer coating film (hereinafter, referred to as "second step"); a step of applying a paste for forming an intermediate layer to a surface of the conductive layer coating film opposite to a surface thereof in contact with the first intermediate layer coating film to form a second intermediate layer coating film (hereinafter, referred to as "third step"); a step of laminating a second ceramic plate including a conductive material on a surface of the second intermediate layer coating film opposite to a surface thereof in contact with the conductive layer coating film (hereinafter, referred to as "fourth step"); and a step of pressurizing a laminate including the first ceramic plate, the first intermediate layer coating film, the conductive layer coating film, the second intermediate layer coating film, and the second ceramic plate in a thickness direction while heating the laminate (hereinafter, referred to as "fifth step").

Hereinafter, the method for producing the ceramic joined body according to the embodiment will be described with reference to FIG. 1.

In the first step, the first intermediate layer 6 is formed. That is, in the first step, the paste for forming an intermediate layer is applied using a freely selected coating method such as a screen printing method to a predetermined position of one surface 2a of the first ceramic plate 2 to form the coating film (first intermediate layer coating film) for forming the first intermediate layer 6. The intermediate layer 6 may be formed on the entire surface 2a of the ceramic plate 2.

As the paste for forming an intermediate layer, a paste in which the insulating material for forming the first intermediate layer 6 is dispersed in a freely selected solvent is preferably used.

As the solvent in the paste for forming an intermediate layer, for example, isopropyl alcohol is used. The proportion of the material in the paste for forming an intermediate layer can be freely selected and is preferably 20% to 70% by mass and more preferably 30% to 50% by mass.

In the second step, the conductive layer 4 is formed. That is, in the second step, in the coating film for forming the first intermediate layer 6 that is formed on the surface 2a of the first ceramic plate 2, the paste for forming a conductive layer is applied using a freely selected coating method such as a screen printing method to a predetermined position of a surface 6a opposite to a surface thereof in contact with the first ceramic plate 2 to form the coating film (conductive layer coating film) for forming the conductive layer 4.

As the paste for forming a conductive layer, a paste in which the conductive material and the insulating material for forming the conductive layer 4 are dispersed in a solvent is used.

As the solvent in the paste for forming a conductive layer, for example, isopropyl alcohol is used. The proportion of the conductive material and the insulating material in the paste for forming a conductive layer is preferably 10% to 30% by mass and more preferably 20% to 30% by mass.

In the second step, the insulating layer 5 is also formed. That is, in the second step, in the coating film for forming the first intermediate layer 6 that is formed on the surface 2a of the first ceramic plate 2, the paste for forming an insulating layer is applied using a freely selected coating method such as a screen printing method to a predetermined position of the surface 6a opposite to the surface thereof in contact with the first ceramic plate 2 to form the coating film (insulating layer coating film) for forming the insulating layer 5.

As the paste for forming an insulating layer, a paste in which the insulating material for forming the insulating layer 5 is dispersed in a solvent is used.

As the solvent in the paste for forming an insulating layer, for example, isopropyl alcohol is used. The total proportion of the conductive material and the insulating material in the paste for forming a conductive layer can be freely selected and is preferably 20% to 70% by mass and more preferably 30% to 50% by mass. The paste for forming an insulating layer may be applied first, the paste for forming a conductive layer may be applied first, or the two pastes may be applied at the same time. Before or after drying the paste that is applied first, the next paste may be dried. It is preferable that the conductive layer 4 and the insulating layer 5 are formed adjacent to each other.

In the third step, the second intermediate layer 7 is formed. That is, in the third step, the paste for forming an intermediate layer is applied using a freely selected coating method such as a screen printing method to a surface 4a of the coating film for forming the conductive layer 4 opposite to a surface thereof in contact with the coating film for forming the first intermediate layer 6 and to a surface 5a of the coating film for forming the insulating layer 5 opposite to a surface thereof in contact with the coating film for forming the first intermediate layer 6 to form the coating film (second intermediate layer coating film) for forming the second intermediate layer 7.

As the paste for forming an intermediate layer, a paste in which the insulating material for forming the second intermediate layer 7 is dispersed in a solvent is used.

As the solvent in the paste for forming an intermediate layer, for example, isopropyl alcohol is used. A preferable proportion of the material in the paste for forming the intermediate layer 7 is the same as the preferable condition of the intermediate layer 6.

In the fourth step, the layers are laminated such that a surface 3a of the second ceramic plate 3 faces a surface of the coating film for forming the second intermediate layer 7 opposite to a surface thereof in contact with the coating film for forming the conductive layer 4 and the coating film for forming the insulating layer 5.

The first to fourth steps may or may not include a drying step of drying the applied paste to a desired state.

In the fifth step, the laminate including the first ceramic plate 2, the coating film for forming the first intermediate layer 6, the coating film for forming the conductive layer 4, the coating film for forming the insulating layer 5, the coating film for forming the second intermediate layer 7, and the second ceramic plate 3 is pressurized in the thickness direction while being heated. The atmosphere in which the laminate is pressurized in the thickness direction while being heated is preferably a vacuum or an inert atmosphere such as Ar, He, or $N_2$.

A temperature (heat treatment temperature) at which the laminate is heated is freely selected and is preferably 1600° C. or higher and 1900° C. or lower and more preferably 1650° C. or higher and 1850° C. or lower. The temperature may be 1700° C. or higher and 1800° C. or lower. When the temperature at which the laminate is heated is 1600° C. or higher and 1900° C. or lower, the solvent in each of the coating films is volatilized such that the first intermediate layer 1, the conductive layer 4, the insulating layer 5, and the second intermediate layer 7 can be preferably formed between the first ceramic plate 2 and the second ceramic plate 3. In addition, the first ceramic plate 2 and the second ceramic plate 3 can be preferably joined and integrated through the second intermediate layer 7, the conductive layer 4, the insulating layer 5, and the second intermediate layer 7.

A pressure (welding pressure) at which the laminate is pressurized in the thickness direction is freely selected and is preferably 1.0 MPa or more and 50.0 MPa or less, more preferably 3.0 MPa or more and 35.0 MPa or less, and still more preferably 5.0 MPa or more and 20.0 MPa or less.

When the pressure at which the laminate is pressurized in the thickness direction is 1.0 MPa or more and 50.0 MPa or less, the second intermediate layer 7, the conductive layer 4, the insulating layer 5, and the second intermediate layer 7 that adhere to each other can be preferably formed between the first ceramic plate 2 and the second ceramic plate 3. In addition, the first ceramic plate 2 and the second ceramic plate 3 can be preferably joined and integrated through the second intermediate layer 7, the conductive layer 4, the insulating layer 5, and the second intermediate layer 7.

[Electrostatic Chucking Device]

Hereinafter, an electrostatic chucking device according to an embodiment of the present invention will be described with reference to FIG. 3.

Figure 3:
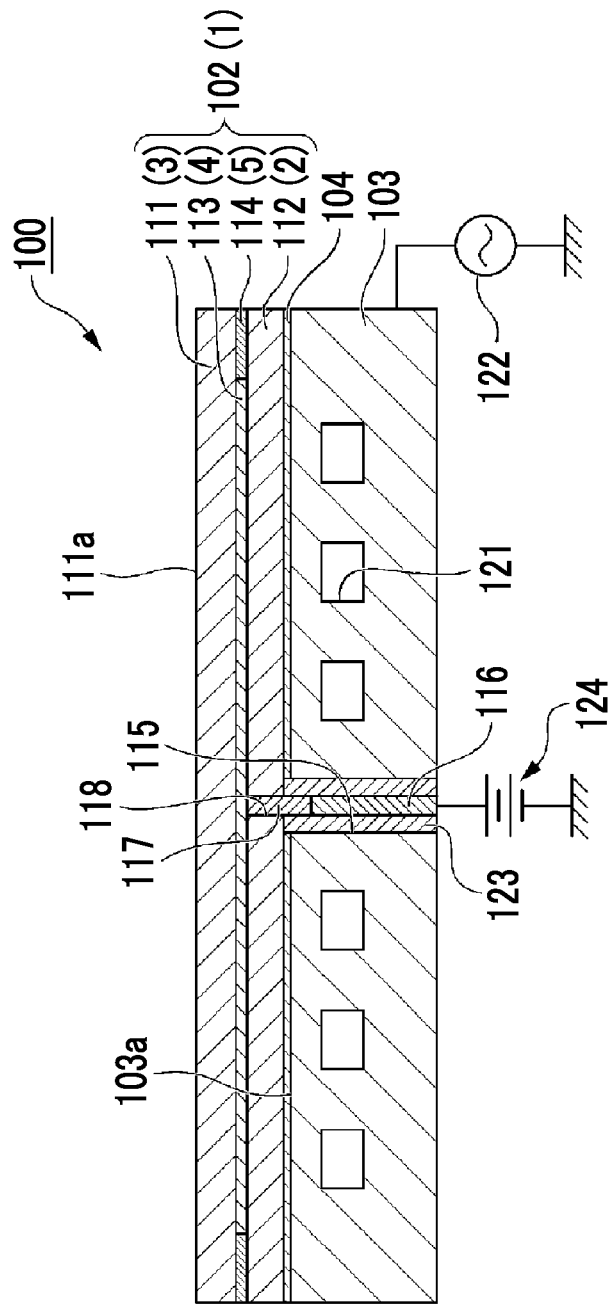
FIG. 3 is a schematic cross-sectional view showing an example of an electrostatic chucking device according to one preferable embodiment of the present invention.

FIG. 3 is a schematic cross-sectional view showing an example of the electrostatic chucking device according to the embodiment. In FIG. 3, the same components as those of the ceramic joined body shown in FIG. 1 are represented by the same reference numerals, and the repeated description thereof will not be repeated.

As shown in FIG. 3, an electrostatic chucking device 100 according to the embodiment includes: a disk-shaped electrostatic chuck member 102; a disk-shaped base member 103 for adjusting a temperature that adjusts the electrostatic chuck member 102 to a desired temperature; and an adhesive layer 104 that joins and integrates the electrostatic chuck member 102 and the base member 103 for adjusting a temperature. In the electrostatic chucking device 100 according to the embodiment, the electrostatic chuck member 102 is, for example, the ceramic joined body 1 or the ceramic joined body 10 according to the embodiment. Here, a case where the electrostatic chuck member 102 is the ceramic joined body 1 will be described.

In the following description, a placement surface 111a side of a placement plate 111 is set as "upper side" and the base member 103 for adjusting a temperature is set as "lower side" to represent relative positions of the components.

[Electrostatic Chuck Member]

The electrostatic chuck member 102 includes: a placement plate 111 that is formed of a ceramic and has, as a top surface, the placement surface 111a on which a plate-shaped sample such as a semiconductor wafer is placed; a supporting plate 112 that is provided on a surface side of the placement plate 111 opposite to the placement surface 111a; an electrode 113 for electrostatic adsorption that is interposed between the placement plate 111 and the supporting plate 112; an annular insulating material 114 that surrounds the periphery of the electrode 113 for electrostatic adsorption interposed between the placement plate 111 and the supporting plate 112; and a power feeding terminal 116 that is provided in a fixing hole 115 of the base member 103 for adjusting a temperature to be in contact with the electrode 113 for electrostatic adsorption.

In the electrostatic chuck member 102, the placement plate 111 may correspond to the second ceramic plate 3, the supporting plate 112 may correspond to the first ceramic plate 2, the electrode 113 for electrostatic adsorption may correspond to the conductive layer 4, and the insulating material 114 may correspond to the insulating layer 5.

[Placement Plate]

On the placement surface 111a of the placement plate 111 (second ceramic plate 3), a plurality of protrusions for supporting the plate-shaped sample such as a semiconductor wafer are preferably vertically provided (not shown). Further, in order to prevent leakage of cold gas such as helium (He) in a peripheral portion of the placement surface 111a of the placement plate 111, an annular protrusion having a square shape in cross-section may be provided to surround the peripheral portion.

Further, in a region around the annular protrusion on the placement surface 111a, a plurality of protrusions that have the same height as the annular protrusion, have a circular shape in cross-section, and has a substantially rectangular shape in vertical section may be provided. This way, the placement plate 111 can be preferably treated.

The thickness of the placement plate 111 can be freely selected and is preferably 0.3 mm or more and 3.0 mm or less, more preferably 0.4 mm or more and 2.5 mm or less, and still more preferably 0.5 mm or more and 1.5 mm or less. When the thickness of the placement plate 111 is 0.3 mm or more, voltage endurance is excellent. On the other hand, when the thickness of the placement plate 111 is 3.0 mm or less, the electrostatic adsorption force of the electrostatic chuck member 102 does not decrease, thermal conductivity between the plate-shaped sample placed on the placement surface 111a of the placement plate 111 and the base member 103 for adjusting a temperature does not deteriorate, and the temperature of the plate-shaped sample that is being processed can be maintained at a given preferable temperature.

[Supporting Plate]

The supporting plate 112 (first ceramic plate 2) supports the placement plate 111 and the electrode 113 for electrostatic adsorption from the lower side.

The thickness of the supporting plate 112 is preferably 0.3 mm or more and 3.0 mm or less, more preferably 0.4 mm or more and 2.5 mm or less, and more preferably 0.5 mm or more and 1.5 mm or less. When the thickness of the supporting plate 112 is 0.3 mm or more, a sufficient withstand voltage can be secured. On the other hand, when the thickness of the supporting plate 112 is 3.0 mm or less, the electrostatic adsorption force of the electrostatic chuck member 102 does not decrease, thermal conductivity between the plate-shaped sample placed on the placement surface 111a of the placement plate 111 and the base member 103 for adjusting a temperature does not deteriorate, and the temperature of the plate-shaped sample that is being processed can be maintained at a given preferable temperature.

[Electrode for Electrostatic Adsorption]

In the electrode 113 for electrostatic adsorption (conductive layer 4), by applying a voltage, the electrostatic adsorption force with which the plate-shaped sample is supported on the placement surface 111a of the placement plate 111 is generated.

The thickness of the electrode 113 for electrostatic adsorption can be freely selected and is preferably 5 μm or more and 200 μm or less, more preferably 8 μm or more and 150 μm or less, and still more preferably 10 μm or more and 100 μm or less. The thickness may be 20 μm or more and 80 μm or less or 40 μm or more and 60 μm or less. When the thickness of the electrode 113 for electrostatic adsorption is 5 μm or more, sufficient conductivity can be secured. On the other hand, when the thickness of the electrode 113 for electrostatic adsorption is 200 μm or less, thermal conductivity between the plate-shaped sample placed on the placement surface 111a of the placement plate 111 and the base member 3 for adjusting a temperature does not deteriorate, and the temperature of the plate-shaped sample that is being processed can be maintained at a given desirable temperature. In addition, plasma permeability does not deteriorate, and plasma can be stably generated.

[Insulating Material]

The insulating material 114 (insulating layer 5) surrounds the electrode 113 for electrostatic adsorption to protect the electrode 113 for electrostatic adsorption from corrosive gas and plasma thereof.

Due to the insulating material 114, the placement plate 111 and the supporting plate 112 are joined and integrated through the electrode 113 for electrostatic adsorption.

[Power Feeding Terminal]

The power feeding terminal 116 applies a voltage to the electrode 113 for electrostatic adsorption.

The number, the shape, and the like of the power feeding terminals 116 are freely determined depending on the form of the electrode 113 for electrostatic adsorption, that is, whether the electrode 113 for electrostatic adsorption is unipolar or bipolar.

The material of the power feeding terminal 116 is not particularly limited as long as it is a conductive material having excellent heat resistance. As the material of the power feeding terminal 116, a material having a thermal expansion coefficient similar to those of the electrode 113 for electrostatic adsorption and the supporting plate 112 is preferable. For example, a metal material such as a cobalt alloy or niobium (Nb) and various conductive ceramics are preferably used.

[Conductive Adhesive Layer]

A conductive adhesive layer 117 is provided in the fixing hole 115 of the base member 103 for adjusting a temperature and in a through hole 118 of the supporting plate 112. In addition, the conductive adhesive layer 117 is interposed between the electrode 113 for electrostatic adsorption and the power feeding terminal 116 and electrically connects the electrode 113 for electrostatic adsorption and the power feeding terminal 116 to each other.

A conductive adhesive forming the conductive adhesive layer 117 can be freely selected and preferably includes a conductive material such as carbon fibers or metal powder and a resin.

As the resin in the conductive adhesive, any resin can be freely selected without any particular limitation as long as it suppresses the occurrence of cohesive failure caused by thermal stress. Examples of the resin include a silicone resin, an acrylic resin, an epoxy resin, a phenol resin, a polyurethane resin, and an unsaturated polyester resin.

Among these, a silicone resin is preferably used from the viewpoints that the degree of expansion and contraction is high and cohesive failure caused by a change in thermal stress is not likely to occur.

[Base Member for Adjusting Temperature]

The base member 103 for adjusting a temperature is a disk-shaped thick member formed of at least one of a metal or a ceramic. The body of the base member 103 for adjusting a temperature is configured to function as an internal electrode for generating a plasma. In the body of the base member 103 for adjusting a temperature, a flow path 121 for circulating a coolant such as water, He gas, or $N_2$ gas is formed.

The body of the base member 103 for adjusting a temperature is connected to an external high frequency power supply 122. In addition, in the fixing hole 115 of the base member 103 for adjusting a temperature, the power feeding terminal 116 of which the outer periphery is surrounded by an insulating material 123 is fixed through the insulating material 123. The power feeding terminal 116 is connected to an external direct current power supply 124.

A material forming the base member 103 for adjusting a temperature is not particularly limited as long as it is a metal having excellent thermal conductivity, electrical conductivity, and workability or a compound material including the metal. As the material for forming the base member 3 for adjusting a temperature, for example, aluminum (Al), copper (Cu), stainless steel (SUS), or titanium (Ti) is preferably used.

It is preferable that at least a surface of the base member 103 for adjusting a temperature that is exposed to a plasma undergoes an alumite treatment or is coated with a resin such as a polyimide resin. In addition, it is more preferable that the entire surface of the base member 103 for adjusting a temperature undergoes an alumite treatment or is coated with a resin.

The base member 103 for adjusting a temperature undergoes an alumite treatment or is coated with a resin such that plasma resistance of the base member 103 for adjusting a temperature is improved and abnormal discharge is prevented. Accordingly, the plasma stability of the base member 103 for adjusting a temperature can be improved, and surface scratches of the base member 103 for adjusting a temperature can also be prevented.

[Adhesive Layer]

An adhesive layer 104 is a layer for bonding and integrating an electrostatic chuck portion 102 and a base portion 103 for cooling.

The thickness of the adhesive layer 104 can be freely selected and is preferably 100 μm or more and 200 μm or less and more preferably 130 μm or more and 170 μm or less.

When the thickness of the adhesive layer 104 is in the above-described range, the adhesion strength between the electrostatic chuck portion 102 and the base portion 103 for cooling can be secured. In addition, the thermal conductivity between the electrostatic chuck portion 102 and the base portion 103 for cooling can be sufficiently secured.

A material of the adhesive layer 104 can be freely selected and is formed of, for example, a cured product obtained by thermally curing a silicone resin composition, an acrylic resin, or an epoxy resin.

The silicone resin composition is a silicon compound having a siloxane bond (Si—O—Si) and is a resin having excellent heat resistance and elasticity, which is more preferable.

As the silicone resin composition, in particular, a silicone resin having a thermal curing temperature of 70° C. to 140° C. is preferable.

Here, it is not preferable that the thermal curing temperature is lower than 70° C. because, when the electrostatic chuck portion 102 and the base portion 103 for cooling are joined in a state where they face each other, curing does not progress sufficiently in the process of joining such that the workability may deteriorate. On the other hand, it is not preferable that the thermal curing temperature is higher than 140° C. because a difference in thermal expansion between the electrostatic chuck portion 102 and the base portion 103 for cooling is large and stress between the electrostatic chuck portion 102 and the base portion 103 for cooling increases, which may cause peeling therebetween.

In the electrostatic chucking device 100 according to the embodiment, the electrostatic chuck member 102 is formed of the ceramic joined body 1. Therefore, in the electrostatic chuck member 102, the occurrence of breakdown (discharge) can be suppressed.

Hereinafter, a method for producing the electrostatic chucking device according to the embodiment will be described.

The electrostatic chuck member 102 formed of the ceramic joined body 1 obtained as described above is prepared.

An adhesive formed of a silicone resin composition is applied to a predetermined region of one main surface 103a of the base portion 103 for cooling. Here, the amount of the adhesive applied is adjusted such that the electrostatic chuck portion 102 and the base portion 103 for cooling are joined and integrated.

Examples of a method for applying the adhesive include a method for manually applying the organic adhesive with a spatula, a bar coating method, and a screen printing method.

After applying the adhesive to the main surface 103a of the base portion 103 for cooling, the electrostatic chuck portion 102 (ceramic joined body 1) and the base portion 103 for cooling to which the adhesive is applied are laminated.

In addition, the power feeding terminal 116 that is vertically provided is inserted into the fixing hole 115 that penetrates the base portion 103 for cooling.

Next, the electrostatic chuck portion 102 is pressed against the base portion 103 for cooling at a predetermined pressure such that the electrostatic chuck portion 102 and the base portion 103 for cooling are joined and integrated. As a result, the electrostatic chuck portion 102 and the base portion 103 for cooling are joined and integrated through the adhesive layer 104.

As a result, the electrostatic chucking device 100 according to the embodiment where the electrostatic chuck portion 102 and the base portion 103 for cooling are joined and integrated through the adhesive layer 104 can be obtained.

The plate-shaped sample according to the embodiment is not limited to a semiconductor wafer and may be, for example, a glass substrate for a flat panel display (FPD) such as a liquid crystal display (LCD), a plasma display (PDP), or an organic EL display. In addition, the electrostatic chucking device according to the embodiment may be designed according to the shape or size of the substrate.

EXAMPLES

Hereinafter, the present invention will be described in detail using Examples and Comparative Examples, but is not limited to the following examples.

Example 1

[Preparation of Ceramic Joined Body]

Mixed powder including 91% by mass of aluminum oxide powder and 9% by mass of silicon carbide powder was prepared and was molded and sintered. As a result, a ceramic plate (the first ceramic plate, the second ceramic plate) formed of an aluminum oxide-silicon carbide composite sintered compact (composite body of aluminum oxide and silicon carbide) having a disk shape with a diameter of 450 mm and a thickness of 5.0 mm was prepared.

Using a screen printing method, a paste for forming an intermediate layer was applied to one surface of the first ceramic plate to form a first intermediate layer coating film.

As the paste for forming an intermediate layer, a paste in which aluminum oxide powder was dispersed in isopropyl alcohol was used. The content of the aluminum oxide powder in the paste for forming an intermediate layer was 50% by mass.

Next, in the first intermediate layer coating film formed on the one surface of the first ceramic plate, a paste for forming a conductive layer was applied using a screen printing method to a predetermined position of a surface opposite to a surface thereof in contact with the first ceramic plate to form a conductive layer coating film. In addition, in the first intermediate layer coating film formed on the one surface of the first ceramic plate, a paste for forming an insulating layer was applied using a screen printing method to a predetermined position of a surface opposite to a surface thereof in contact with the first ceramic plate to form an insulating layer coating film. The insulating layer and the conductive layer were formed not to overlap each other. In addition, the shape of the conductive layer in a plan view was circular. The shape of the insulating layer was a shape surrounding the outer periphery of the conductive layer. The outer periphery of the insulating layer was the same as the outer periphery of the first ceramic plate. That is, the insulating layer and the first ceramic plate were formed such that the outer peripheries thereof match each other in a plan view. In addition, the thickness of the insulating layer was the same as that of the conductive layer coating film.

As the paste for forming a conductive layer, a paste in which aluminum oxide powder and molybdenum carbide powder were dispersed in isopropyl alcohol was used. In the paste for forming a conductive layer, the content of the aluminum oxide powder was 25% by mass, and the content of the molybdenum carbide powder was 25% by mass. As the paste for forming an insulating layer, a paste in which aluminum oxide powder having an average primary particle diameter of 2.0 μm was dispersed in isopropyl alcohol was used. The content of the aluminum oxide powder in the paste for forming an insulating layer was 50% by mass.

Next, the paste for forming an intermediate layer was applied using a screen printing method to a surface of the conductive layer coating film opposite to a surface thereof in contact with the first intermediate layer coating film and to a surface of the insulating layer coating film opposite to a surface thereof in contact with the first intermediate layer coating film. As a result, a second intermediate layer coating film was formed.

Next, the second ceramic plate was laminated on a surface of the second intermediate layer coating film opposite to a surface thereof in contact with the conductive layer coating film and the insulating layer coating film.

Next, a laminate including the first ceramic plate, the first intermediate layer coating film, the conductive layer coating film, the insulating layer coating film, the second intermediate layer coating film, and the second ceramic plate was pressurized in a thickness direction while being heated in an argon atmosphere. The heat treatment temperature was 1700° C., the welding pressure was 10 MPa, and the time for which the heat treatment and the pressurization were performed was 2 hours.

Through the above-described steps, a ceramic joined body according to Example 1 shown in FIG. 1 was obtained. In the obtained ceramic joined body, a ratio (R1) of the sum t2 of the thickness of the first intermediate layer and the thickness of the second intermediate layer to the thickness t1 of the conductive layer defined by the following formula (1) was 4%. In addition, the thickness t1 of the conductive layer and the sum t2 of the thickness of the first intermediate layer and the thickness of the second intermediate layer are values obtained by observing a cross-section of the ceramic joined body with a SEM.

$$R1 = t2/t1 \times 100 (\%) \tag{1}.$$

(Insulating Characteristics Evaluation)

The insulating characteristics of the ceramic joined body were evaluated as described below.

On a side surface of the ceramic joined body (side surface of the ceramic joined body in the thickness direction), a carbon tape was bonded in contact with the first ceramic plate, the first intermediate layer, the insulating layer, the second intermediate layer, and the second ceramic plate. The conductive layer was surrounded by the insulating layer, and thus was not in contact with the carbon tape.

A through electrode that penetrated the first ceramic plate and the first intermediate layer in the thickness direction and reached the conductive layer from the surface of the first ceramic plate opposite to the surface in contact with the first intermediate layer was formed. The through electrode was provided in contact with the conductive layer.

A voltage was applied to the ceramic joined body through the carbon tape and the through electrode, and a voltage at which breakdown (discharge) occurred in the ceramic joined body was measured. Specifically, an RF voltage was applied in a state where a voltage of 3000 V was applied, and this state was maintained for 10 minutes. Next, a voltage of 500 V was gradually applied, and this state was maintained for 10 minutes. When the measured current value exceeded 0.1 mA (milliampere), breakdown occurred. The results are shown in Table 1.

Example 2

A ceramic joined body according to Example 2 was obtained using the same method as that of Example 1, except that the average primary particle diameter of the aluminum oxide powder in the insulating layer was 3.0 μm and the heat treatment temperature of the laminate including the first ceramic plate, the first intermediate layer coating film, the conductive layer coating film, the insulating layer coating film, the second intermediate layer coating film, and the second ceramic plate was 1750° C.

The insulating characteristics of the ceramic joined body according to Example 2 were evaluated using the same method as that of Example 1. The results are shown in Table 1.

Example 3

A ceramic joined body according to Example 3 was obtained using the same method as that of Example 1, except that the average primary particle diameter of the aluminum oxide powder in the insulating layer was 1.9 μm. In the obtained ceramic joined body, the ratio (R1) of the sum t2 of the thickness of the first intermediate layer and the thickness of the second intermediate layer to the thickness t1 of the conductive layer was 8%.

The insulating characteristics of the ceramic joined body according to Example 3 were evaluated using the same method as that of Example 1. The results are shown in Table 1.

Example 4

A ceramic joined body according to Example 4 was obtained using the same method as that of Example 1, except that the average primary particle diameter of the aluminum oxide powder in the insulating layer was 3.3 μm and the heat treatment temperature of the laminate including the first ceramic plate, the first intermediate layer coating film, the conductive layer coating film, the insulating layer coating film, the second intermediate layer coating film, and the second ceramic plate was 1750° C. In the obtained ceramic joined body, the ratio (R1) of the sum t2 of the thickness of the first intermediate layer and the thickness of the second intermediate layer to the thickness t1 of the conductive layer was 8%.

The insulating characteristics of the ceramic joined body according to Example 4 were evaluated using the same method as that of Example 1. The results are shown in Table 1.

Example 5

A ceramic joined body according to Example 5 was obtained using the same method as that of Example 1, except that the average primary particle diameter of the aluminum oxide powder in the insulating layer was 5.8 μm and the heat treatment temperature of the laminate including the first ceramic plate, the first intermediate layer coating film, the conductive layer coating film, the insulating layer coating film, the second intermediate layer coating film, and the second ceramic plate was 1800° C. In the obtained ceramic joined body, the ratio (R1) of the sum t2 of the thickness of the first intermediate layer and the thickness of the second intermediate layer to the thickness t1 of the conductive layer was 13%.

The insulating characteristics of the ceramic joined body according to Example 5 were evaluated using the same method as that of Example 1. The results are shown in Table 1.

[Comparative Example]

A ceramic joined body according to Comparative Example was obtained using the same method as that of Example 1, except that the first intermediate layer and the second intermediate layer were not provided and the average primary particle diameter of the aluminum oxide powder in the insulating layer was 1.5 μm.

The insulating characteristics of the ceramic joined body according to Comparative Example were evaluated using the same method as that of Example 1. The results are shown in Table 1.

TABLE 1

| | Heat Treatment Temperature [° C.] | t2/t1 × 100 [%] | Average Primary Particle Diameter of $Al_2O_3$ Powder in Insulating Layer [μm] | Breakdown Voltage [kV/mm] |
|---|---|---|---|---|
| Example 1 | 1700 | 4 | 2.0 | 8 |
| Example 2 | 1750 | 4 | 3.0 | 9 |
| Example 3 | 1700 | 8 | 1.9 | 17 |
| Example 4 | 1750 | 8 | 3.3 | 18 |
| Example 5 | 1800 | 13 | 5.8 | 19 |
| Comparative Example | 1700 | 0 | 1.5 | 4 |

It was found from the results of Table 1 that, although the breakdown voltage in the ceramic joined body according to Comparative Example where the intermediate layers were not provided was low, the breakdown voltage in the ceramic joined bodies according to Examples 1 to 5 where the intermediate layers were provided was high. In addition, when the average primary particle diameter of the aluminum oxide powder used in the insulating layer was high, the dielectric strength was high (comparison between Examples 1 and 2 and comparison between Examples 3 and 4). The reason for this is presumed to be that the area of a grain boundary having low insulating characteristics was reduced by coarsening of the aluminum oxide particles.

INDUSTRIAL APPLICABILITY

The present invention provides a ceramic joined body in which the occurrence of breakdown (discharge) is suppressed at a joint interface between a ceramic plate and a conductive layer, an electrostatic chucking device, and a method for producing the ceramic joined body.

In the ceramic joined body according to the present invention, the intermediate layers are interposed between the ceramic plate and the conductive layer are in contact with the ceramic plate and the conductive layer. As a result, the occurrence of breakdown (discharge) is suppressed at a joint interface between the ceramic plate and the conductive layer. Accordingly, the ceramic joined body according to the present invention is suitably used for an electrostatic chuck member of an electrostatic chucking device, and the usefulness thereof is significantly high.

REFERENCE SIGNS LIST 1, 10: ceramic joined body
2: ceramic plate (first ceramic plate)
2a: one surface of first ceramic plate
3: ceramic plate (second ceramic plate)
3a: one surface of second ceramic plate
4: conductive layer
4a: one surface of conductive layer
5: insulating layer
5a: one surface of insulating layer
6: intermediate layer (first intermediate layer)
6a: one surface of first intermediate layer
7: intermediate layer (second intermediate layer)
100: electrostatic chucking device
102: electrostatic chuck member
103: base member for adjusting a temperature (base for cooling)
103a: one main surface of base portion for cooling
104: adhesive layer
111: placement plate
111a: placement surface of placement plate
112: supporting plate
113: electrode for electrostatic adsorption
114: insulating material
115: fixing hole
116: power feeding terminal
117: conductive adhesive layer
118: through hole
121: flow path
122: high frequency power supply
123: insulating material
124: direct current power supply

The invention claimed is:

1. A ceramic joined body comprising:
a pair of ceramic plates that include a conductive material;
a conductive layer and an insulating layer that are interposed between the pair of ceramic plates;
a pair of intermediate layers that are interposed between the pair of ceramic plates and the conductive layer and are in contact with the pair of ceramic plates and the conductive layer; and
wherein when a thickness of the conductive layer is represented by t1 and a total thickness of the intermediate layers is represented by t2, a thickness ratio R1 of the intermediate layers which is defined by a following formula (1) is 3% or more, $$R1 = t2/t1 \times 100 (\%) \tag{1}$$

2. The ceramic joined body according to claim 1,
wherein the conductive layer is formed of a conductive material and an insulating material, and
the insulating layer and the intermediate layer are formed of an insulating material.

3. The ceramic joined body according to claim 2,
wherein an average primary particle diameter of the insulating material which forms the insulating layer is 1.6 μm or more and 10.0 μm or less.

4. The ceramic joined body according to claim 2,
wherein the insulating materials which are included in the conductive layer, the insulating layer, and the intermediate layer consist of aluminum oxide.

5. The ceramic joined body according to claim 2,
wherein the conductive material which is included in the conductive layer is at least one selected from the group consisting of $MO_2C$, Mo, WC, W, TaC, Ta, SiC, carbon black, carbon nanotubes, and carbon nanofibers.

6. The ceramic joined body according to claim 1,
wherein the thickness ratio R1 is 50% or less.

7. The ceramic joined body according to claim 1,
wherein the ceramic plate is formed of a composite body of aluminum oxide and silicon carbide.

8. An electrostatic chucking device,
wherein an electrostatic chuck member formed of a ceramic and a base member for adjusting a temperature formed of a metal are joined through an adhesive layer, and
the electrostatic chuck member is formed of the ceramic joined body according to claim 1.

9. A method for producing the ceramic joined body according to claim 1, comprising:
- a step of preparing a first ceramic plate including a conductive material and a second ceramic plate including a conductive material;
- a step of applying a paste for forming an intermediate layer to one surface of the first ceramic plate to form a first intermediate layer coating film;
- a step of applying a paste for forming a conductive layer to a surface of the first intermediate layer coating film opposite to a surface thereof which is in contact with the first ceramic plate, to form a conductive layer coating film;
- a step of applying a paste for forming an intermediate layer to a surface of the conductive layer coating film opposite to a surface thereof which is in contact with the first intermediate layer coating film, to form a second intermediate layer coating film;
- a step of laminating the second ceramic plate on a surface of the second intermediate layer coating film opposite to a surface thereof which is in contact with the conductive layer coating film; and
- a step of pressurizing a laminate including the first ceramic plate, the first intermediate layer coating film, the conductive layer coating film the second intermediate layer coating film, and the second ceramic plate in a thickness direction while heating the laminate.

10. The method for producing a ceramic joined body according to claim 9, further comprising:
- a step of applying a paste for forming an insulating layer to the surface of the first intermediate layer coating film to form an insulating layer coating film side by side with the conductive layer coating film, wherein the step is performed between. the step of forming the conductive layer coating film and the step of forming the second intermediate layer coating film.

11. The method for producing a ceramic joined body according to claim 10, wherein
the paste for forming an intermediate layer is totally applied to the one surface of the first ceramic plate,
the paste for forming a conductive layer is partially applied to the surface of the first intermediate layer coating film,
the paste for forming an insulating layer is applied to the surface of the first intermediate layer coating film so that the insulating layer coating film surrounds the conductive layer coating film,
the paste for forming an intermediate layer is applied to the surface of the conductive layer coating film and a surface of the insulating layer coating film in order to form a second intermediate layer coating film.

12. The method for producing a ceramic joined body according to claim 9, wherein
the paste for forming an intermediate layer is partially applied to the one surface of the first ceramic plate,
the paste for forming a conductive layer is applied to the surface of the first intermediate layer coating film,
the paste for forming an insulating layer is applied to the one surface of the first ceramic plate so that the insulating layer coating film surrounds the conductive layer coating film,
the paste for forming an intermediate layer is applied to the surface of the conductive layer coating film in order to form the second intermediate layer coating film, and
the second ceramic plate is laminated on the surface of the second intermediate layer coating film and a surface of the insulating layer coating film.

13. The method for producing a ceramic joined body according to claim 9, wherein the first intermediate layer, the conductive layer, and the second intermediate layer are formed in the pressurizing step by volatilizing solvent included in the first intermediate layer coating film, the conductive layer coating film and the second intermediate layer coating film.

14. The ceramic joined body according to claim 1,
wherein the insulating layer is disposed on an outer periphery of a conductive layer,
the ceramic plate is formed of a composite body of aluminum oxide and silicon carbide,
the conductive layer is formed of aluminum oxide and molybdenum carbide,
the insulating layer is formed of aluminum oxide, and
the intermediate layer is formed of aluminum oxide.

15. The ceramic joined body according to claim 1,
wherein the ceramic plates have a circular shape or a donut shape in a plan view,
the conductive layer has a circular shape or a donut shape in a plan view, and
the insulating layer is disposed on an outer periphery of the conductive layer.

16. The ceramic joined body according to claim 1,
wherein the pair of intermediate layers are also interposed between the pair of ceramic plates and the insulating layer, and are in contact with the pair of ceramic plates and the insulating layer.

17. The ceramic joined body according to claim 1,
wherein upper and lower surfaces of the insulating layer are in contact with the pair of ceramic plates, and wherein the thickness ratio R1 is 3% or more and 30% or less.

18. The ceramic joined body according to claim 1,
wherein the ceramic plates are made of a material which is at least one selected from a group consisting of an aluminum oxide sintered compact, an aluminum nitride sintered compact, and an aluminum oxide-silicon carbide composite sintered compact.

19. The ceramic joined body according to claim 1,
wherein the intermediate layers are formed of an insulating material which is at least one selected from a group consisting of aluminum oxide, aluminum nitride, yttrium oxide, and yttrium-aluminum-garnet.

20. The ceramic joined body according to claim 1,
wherein the intermediate layers consist of aluminum oxide.

* * * * *